(12) United States Patent
Jung et al.

(10) Patent No.: US 11,621,184 B2
(45) Date of Patent: *Apr. 4, 2023

(54) LASER MARKING DEVICE AND LASER MARKING METHOD

(71) Applicant: EO TECHNICS CO., LTD., Anyang-si (KR)

(72) Inventors: Sung Beom Jung, Anyang-si (KR); Jea Ho Moon, Anyang-si (KR); Soo Young Kim, Anyang-si (KR); Doo Seok Lee, Anyang-si (KR)

(73) Assignee: EO TECHNICS CO., LTD., Anyang-si (KR)

(*) Notice: Subject to any disclaimer, the term of this patent is extended or adjusted under 35 U.S.C. 154(b) by 91 days.

This patent is subject to a terminal disclaimer.

(21) Appl. No.: 17/085,310

(22) Filed: Oct. 30, 2020

(65) Prior Publication Data
US 2021/0050239 A1 Feb. 18, 2021

Related U.S. Application Data

(63) Continuation of application No. 15/998,752, filed as application No. PCT/KR2016/004385 on Apr. 27, 2016, now Pat. No. 10,861,725.

(30) Foreign Application Priority Data

Feb. 16, 2016 (KR) .................. 10-2016-0017764

(51) Int. Cl.
*H01L 21/67* (2006.01)
*H01L 21/268* (2006.01)
*H01L 23/544* (2006.01)

(52) U.S. Cl.
CPC ...... *H01L 21/67282* (2013.01); *H01L 21/268* (2013.01); *H01L 23/544* (2013.01); *H01L 21/67288* (2013.01)

(58) Field of Classification Search
CPC ............ H01L 21/67282; H01L 21/268; H01L 21/67288; H01L 23/544; B23K 26/14;
(Continued)

(56) References Cited

U.S. PATENT DOCUMENTS 7,078,262 B2 * 7/2006 Yamamoto .......... H01L 21/6838
438/758
9,653,338 B2 5/2017 Huang
(Continued)

FOREIGN PATENT DOCUMENTS

CN 104703746 A 6/2015
KR 20020061737 A 7/2002
(Continued)

OTHER PUBLICATIONS

International Search Report (PCT/ISA/210) dated Oct. 20, 2016, by the Korean Patent Office as the International Searching Authority for International Application No. PCT/KR2016/004385.
(Continued)

*Primary Examiner* — Michael M Trinh
(74) *Attorney, Agent, or Firm* — Panitch Schwarze Belisario & Nadel LLP

(57) ABSTRACT

A laser marking device includes a laser emission unit configured to emit a laser beam to a first surface of an object to be processed, and a pressing unit configured to press a second surface that is opposite to the first surface of the object to be processed to make the first surface of the object to be flat. The pressing unit includes a first pressing portion configured to press an edge area of the second surface in a contact manner, and at least one second pressing portion configured to press a middle area of the second surface in a non-contact manner to maintain a separation distance from the second surface within a certain distance.

18 Claims, 9 Drawing Sheets

(58) Field of Classification Search
CPC .... B23K 26/147; B23K 26/1435–1438; B23K 2101/40
See application file for complete search history.

(56) References Cited

U.S. PATENT DOCUMENTS

| | | | |
|---|---|---|---|
| 10,861,725 B2* | 12/2020 | Jung | H01L 23/544 |
| 2002/0093086 A1 | 7/2002 | Lee | |
| 2003/0192866 A1* | 10/2003 | Han | H01L 21/67282 |
| | | | 257/E23.179 |
| 2004/0060910 A1* | 4/2004 | Schramm | B23K 26/042 |
| | | | 257/E23.179 |
| 2004/0118821 A1 | 6/2004 | Han et al. | |
| 2004/0121493 A1* | 6/2004 | Han | H01L 21/67282 |
| | | | 438/7 |
| 2005/0022746 A1 | 2/2005 | Lampe et al. | |
| 2006/0243711 A1 | 11/2006 | Paradis et al. | |
| 2015/0179495 A1* | 6/2015 | Huang | H01L 21/68728 |
| | | | 29/559 |
| 2016/0250735 A1 | 9/2016 | Nabeya et al. | |
| 2017/0062252 A1* | 3/2017 | Wu | H01L 21/68785 |
| 2017/0062263 A1* | 3/2017 | Kesil | H01L 21/67259 |

FOREIGN PATENT DOCUMENTS

| | | |
|---|---|---|
| KR | 20040055415 A | 6/2004 |
| KR | 20110045082 A | 5/2011 |
| KR | 20120030841 A | 3/2012 |
| KR | 20150057305 A | 5/2015 |
| KR | 101594047 B1 | 2/2016 |
| WO | 2014028360 A2 | 2/2014 |

OTHER PUBLICATIONS

Korean Notice of Allowance for Korean Patent Application No. 9-5-2017-087934735, dated Dec. 15, 2017.
Korean Office Action of Korean Patent Application No. 9-5-2017-046795814, dated Jul. 4, 2017.
Taiwanese Office Action for Taiwanese Patent Application No. 10720179660, dated Feb. 27, 2018.
Written Opinion (PCT/ISA/237) dated Oct. 20, 2016, by the Korean Patent Office as the International Searching Authority for International Application No. PCT/KR2016/004385.

* cited by examiner ically start at approximately $2\theta = 4°$ for Cu-Kα radiation and end at approximately $2\theta = 70°$.

LASER MARKING DEVICE AND LASER MARKING METHOD

TECHNICAL FIELD

The present disclosure relates to a laser marking device and a laser marking method.

BACKGROUND ART

Many semiconductor chips are formed on a wafer in a manufacturing process of semiconductor devices. To distinguish the semiconductor chips by production lots, characters and/or numbers are marked at a position corresponding to each semiconductor chip. A laser marking device using a laser beam is used for this purpose. In the past, a lot number is marked on each chip after dicing. With the development of advanced technologies, integrated circuits (IC) are become compact and lightweight. Accordingly, to increase work efficiency and enable mass production, dicing is carried out after each semiconductor chip is marked on a wafer. However, while the wafer size increases, the thickness of the wafer decreases, and thus warpage of the wafer becomes problematic.

A wafer on which many semiconductor chips are formed may be warped in a certain direction due to self-weight, coating of a wafer surface, and other processing. Such a warpage phenomenon occurs more as the size of a wafer increases, the thickness of a wafer decreases, and an amount of contraction during curing of a coating material increases. In this state, when a deviation in the height of a processed surface of a wafer due to the warpage phenomenon is greater than a focal depth of a laser beam, the beam density of a laser output and the size of a laser beam vary according to the position of the processed surface. Thus, marking quality may deteriorate, a line width may be irregular, and a marking position may be inconstant.

DESCRIPTION OF EMBODIMENTS

Technical Problem

Provided are laser marking devices and laser marking methods.

Solution to Problem

According to an aspect of the present disclosure, a laser marking device includes a laser emission unit configured to emit a laser beam to a first surface of an object to be processed, and a pressing unit configured to press a second surface that is opposite to the first surface of the object to be processed to make the first surface of the object to be flat, in which the pressing unit includes a first pressing portion configured to press an edge area of the second surface in a contact manner, and at least one second pressing portion configured to press a middle area of the second surface in a non-contact manner to maintain a separation distance from the second surface within a certain distance.

The at least one second pressing portion may maintain a separation distance between the second pressing portion and the second surface within about 50 μm.

The at least one second pressing portion may include at least one ejection hole through which a gas is ejected toward the second surface of the object to be processed.

A pressure applied by the at least one second pressing portion to the object to be processed may be about 0.01 MPa to about 0.5 MPa.

The first pressing portion may have a ring shape and press the edge area of the second surface due to a weight thereof.

A semiconductor pattern may be arranged in the middle area of the second surface, and the semiconductor pattern may not be arranged in the edge area of the second surface.

The laser marking device may further include a work table on which the object to be processed is placed, and having an opening through which a part of the first surface of the object to be processed is exposed.

The laser marking device may further include a support unit configured to support the pressing unit and transfer the pressing unit to the second surface of the object to be processed.

The support unit may include a suction unit configured to suction and support the pressing unit and a driving unit configured to transfer the pressing unit in a vertical direction.

The support unit may further include a falling prevention unit configured to move between a first position overlapping the pressing unit and a second position that does not overlap the pressing unit to prevent falling of the pressing unit.

According to another aspect of the present disclosure, a laser marking method includes placing an object to be processed on a work table, the object to be processed including a first surface and a second surface that is opposite to the first surface, pressing the second surface of the object to be processed to compensate for a height deviation of the object to be processed, which is performed by a pressing unit, and performing marking by emitting a laser beam to the first surface of the object to be processed, wherein, in the pressing of the second surface, an edge area of the second surface is pressed by a first pressing portion, and a middle area of the second surface is pressed by at least one second pressing portion in a non-contact manner.

A separation distance between the second pressing portion and the second surface may be maintained by the second pressing portion within about 50 μm.

The second pressing portion may eject a gas toward the second surface of the object to be processed.

A pressure applied by the second pressing portion to the object to be processed may be about 0.01 MPa to about 0.5 MPa.

The first pressing portion may have a ring shape, and the edge area of the second surface may be pressed by a weight of the first pressing portion.

A semiconductor pattern may be arranged in the middle area of the second surface, and the semiconductor pattern may not be arranged in the edge area of the second surface.

The laser marking method may further include, before the pressing of the second surface, transferring the pressing unit to the second surface of the object to be processed, which is performed by a support unit.

Advantageous Effects of Disclosure

In a laser marking device and a laser marking method according to the present disclosure, even when an object to be processed is warped and is not flat before laser marking work begins, marking work is performed in a state in which an edge portion of the object to be processed where a semiconductor pattern is not formed is contacted and pressed and a middle portion of the object to be processed where a semiconductor pattern is formed is pressed in a non-contact manner, thereby providing reliable marking quality.

BRIEF DESCRIPTION OF DRAWINGS

FIGS. 4 and 5 illustrate a pressing unit of a laser marking device according to an embodiment, in which FIG. 4 is a plan view of the pressing unit and FIG. 5 is a cross-sectional view of FIG. 4.

BEST MODE

Figure 1:
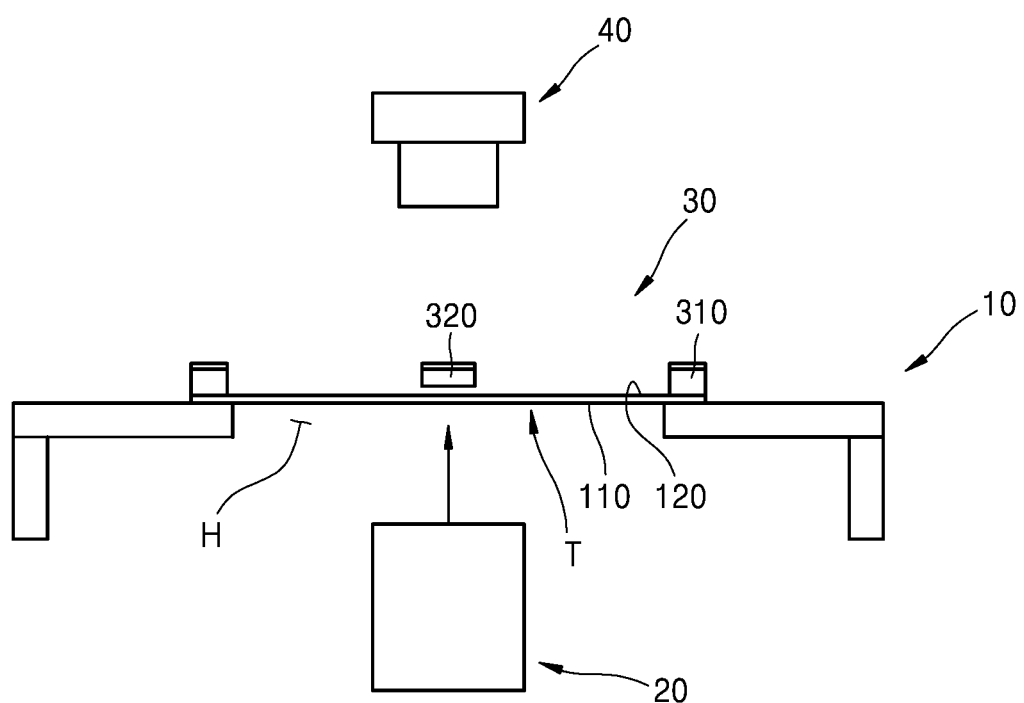
FIG. 1 is a schematic cross-sectional view of a laser marking device according to an embodiment.

Reference will now be made in detail to embodiments, examples of which are illustrated in the accompanying drawings, wherein like reference numerals refer to like elements throughout. The thickness or size of each layer illustrated in the drawings may be exaggerated for convenience of explanation and clarity.

Terms such as "first" and "second" are used herein merely to describe a variety of constituent elements, but the constituent elements are not limited by the terms. Such terms are used only for the purpose of distinguishing one constituent element from another constituent element. For example, without departing from the right scope of the present disclosure, a first constituent element may be referred to as a second constituent element, and vice versa. As used herein, the term "and/or" includes any and all combinations of one or more of the associated listed items.

Figure 2A:
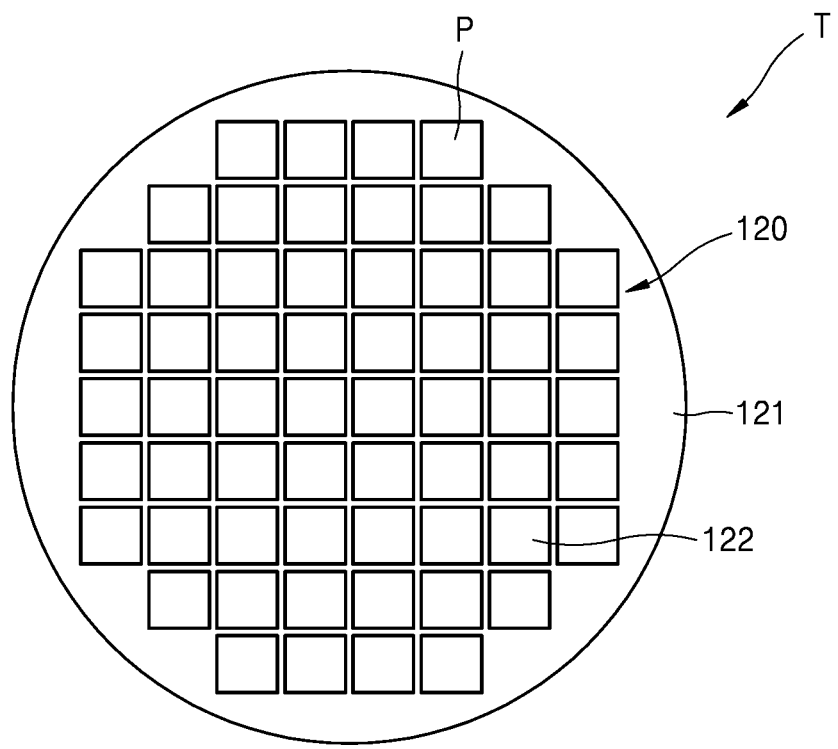
FIGS. 2A and 2B illustrate an example of an object to be processed that is subject to laser processing by a laser marking device, according to an embodiment.
Figure 2B:
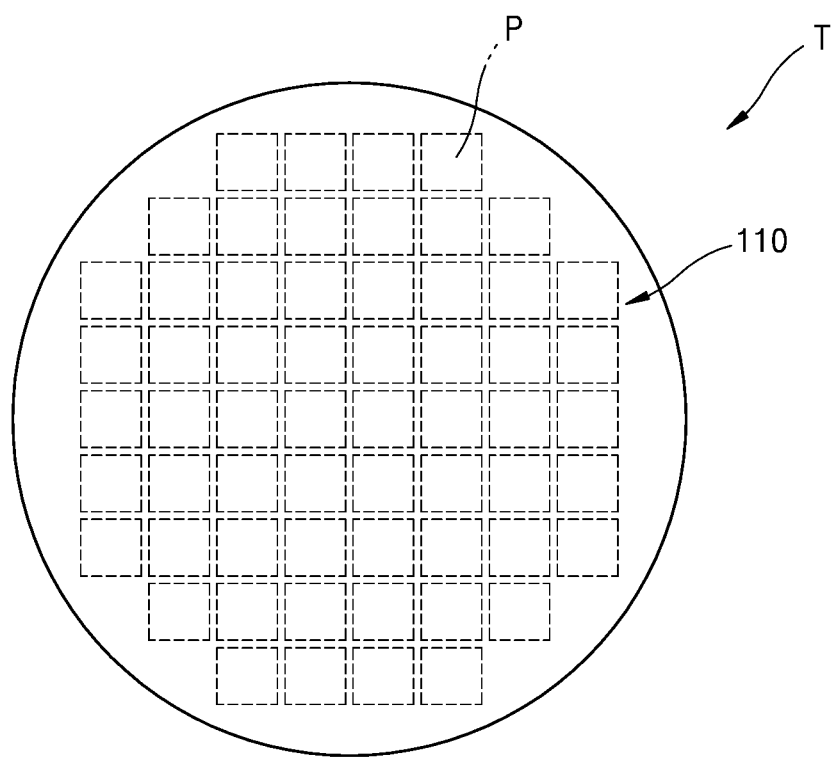
Figure 3A:
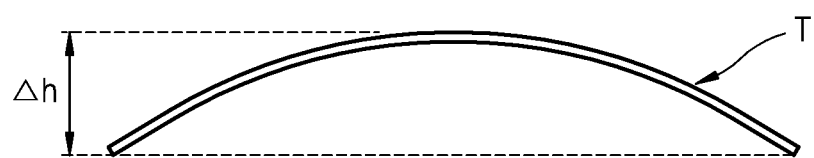
FIGS. 3A and 3B illustrate a state in which the object to be processed is warped.
Figure 3B:
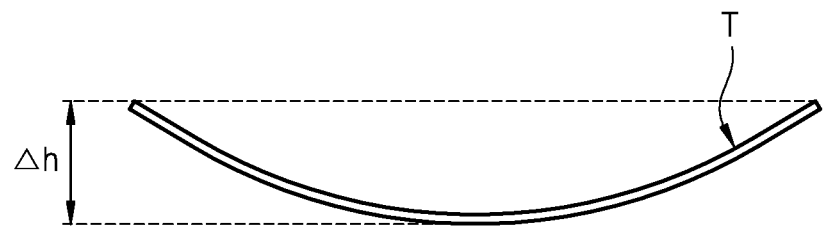

FIG. 1 is a schematic cross-sectional view of a laser marking device according to an embodiment. FIGS. 2A and 2B illustrate an example of an object T to be processed that is subject to laser processing by a laser marking device according to an embodiment. FIGS. 3A and 3B illustrate a state in which the object T to be processed is warped.

Referring to FIG. 1, the laser marking device according to the present embodiment may include a laser emission unit 20, a work table 10 on which the object T to be processed is placed, and a pressing unit 30 pressing the object T to be processed. The laser marking device may further include a vision camera 40.

The laser emission unit 20 emits a laser beam to the object T to be processed. The laser emission unit 20 is arranged under the object T to be processed and emits a laser beam to a lower surface of the object T to be processed, thereby performing marking work on the object T to be processed.

The work table 10 may include an opening H that exposes a part of the lower surface of the object T to be processed. The laser beam emitted by the laser emission unit 20 passes through the opening H and is irradiated to the lower surface of the object T to be processed.

The vision camera 40 takes an image of a semiconductor pattern P (see FIG. 2A) provided on the object T to be processed, thereby identifying a processing position of the object T to be processed. Accordingly, precise processing work may be performed by the laser emission unit 20.

Referring to FIGS. 1, 2A, and 2B, the object T to be processed may include a first surface 110 and a second surface 120 that is opposite to the first surface 110. The first surface 110 may be a lower surface, and the second surface 120 may be an upper surface.

The semiconductor pattern P is arranged in a middle area 122 of the second surface 120 of the object T to be processed. The semiconductor pattern P may not be arranged in an edge area 121 arranged at an outer side of the middle area 122 of the second surface 120.

For example, the object T to be processed may be a wafer, and the semiconductor pattern P may be a plurality of semiconductor chips arranged on a wafer. In this case, while a plurality of semiconductor chips are arranged on the second surface 120, a plurality of semiconductor chips are not arranged on the first surface 110. A plurality of semiconductor chips are arranged in the middle area 122 of the second surface 120, but not in the edge area 121 of the second surface 120.

A laser marking device performs a laser marking work by irradiating a laser beam to the first surface 110 of the object T to be processed on which the semiconductor pattern P is not arranged.

However, the object T to be processed may be warped to be convex as illustrated in FIG. 3A or warped to be concave as illustrated in FIG. 3B for various reasons. For example, the object T to be processed may be warped due to the weight thereof or in a surface coating process of the object T to be processed, a heat treatment process, or other processes. Accordingly, the object T to be processed may have a height deviation $\Delta h$.

The height deviation $\Delta h$ of the object T to be processed may occur by as much as the size of the object T to be processed increases, the thickness thereof decreases, and an amount of contraction of a coating material during curing increases. The height deviation $\Delta h$ of the object T to be processed may be 4 mm to 10 mm.

When a laser beam is focused out of the object T to be processed due to the height deviation $\Delta h$ of the object T to be processed, marking may not be performed. Even when a laser beam is focused on the object T to be processed, but the position of a focus varies, marking quality may deteriorate. For example, a line width may not be constant or a marking position may be changed.

Figure 4:
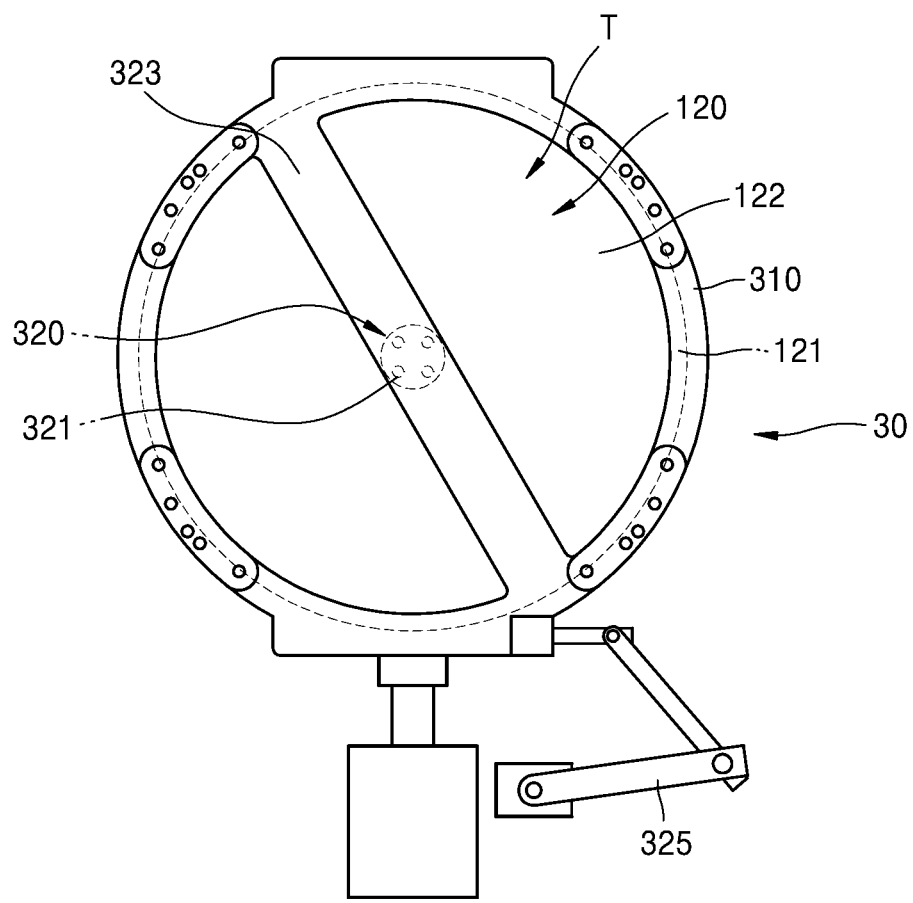
Figure 5:
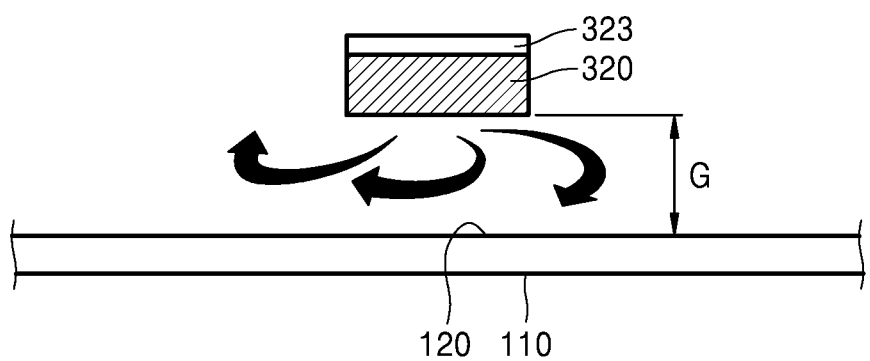

FIGS. 4 and 5 illustrate the pressing unit 30 of a laser marking device, according to an embodiment, in which FIG. 4 is a plan view of the pressing unit 30 and FIG. 5 is a cross-sectional view of FIG. 4.

Referring to FIGS. 1 and 4, the laser marking device according to an embodiment may include the pressing unit 30 pressing the object T to be processed to supplement or compensate for the height deviation $\Delta h$ of the object T to be processed. Before or simultaneously with marking work being performed on the first surface 110 of the object T to be processed, the pressing unit 30 may press the second surface 120 of the object T to be processed.

The pressing unit 30 may include a first pressing portion 310 pressing the edge area 121 of the second surface 120.

The first pressing portion 310 presses the edge area 121 of the second surface 120 in a contact manner.

For example, the first pressing portion 310 may have a ring shape. The first pressing portion 310 may be arranged above the object T to be processed, and may press the edge area 121 of the object T to be processed due to the weight thereof. In this state, since the semiconductor pattern P is not formed at the edge area 121 of the second surface 120, even when the first pressing portion 310 presses the edge area 121 of the object T to be processed in a contact manner, the semiconductor pattern P of the object T to be processed may not be damaged.

When a height deviation of the object T to be processed is within a certain range, the height deviation of the object T to be processed may be reduced or removed by the first pressing portion 310. For example, when the height deviation of the object T to be processed is less than 4 mm, the first pressing portion 310 may reduce the height deviation of the object T to be processed to a range in which marking quality does not deteriorate.

However, when the height deviation of the object T to be processed deviates by a certain range, for example, by about 4 mm or more, there may be a limitation in reducing the height deviation of the object T to be processed only by pressing the edge portion of the object T to be processed in a contact manner. For example, when only the edge portion of the object T to be processed is pressed by the first pressing portion 310, a middle portion of the object T to be processed may warp to be convex or concave. Furthermore, when the size of the object T to be processed increases, a height deviation by the middle portion of the object T to be processed may be difficult to compensate for only by the edge portion of the object T to be processed.

Considering the above, the laser marking device according to an embodiment may further include a second pressing portion 320 pressing the middle area 122 of the second surface 120.

Referring to FIGS. 4 and 5, the second pressing portion 320 presses the middle area 122 of the second surface 120 in a non-contact manner. A pressure applied to the object T to be processed by the second pressing portion 320 may be about 0.01 MPa to about 0.5 MPa. In this regard, pressing the middle area 122 of the second surface 120 in a non-contact manner may include pressing the middle area 122 of the second surface 120 in a downward direction and also pulling the middle area 122 of the second surface 120 in an upward direction.

The second pressing portion 320 may provide a suction force or a repulsive force according to the Bernoulli's principle to the object T to be processed. The second pressing portion 320 may be a Bernoulli chuck. Accordingly, the second pressing portion 320 may maintain a separation distance G from the second surface 120 within a certain distance. For example, the separation distance G between the second pressing portion 320 and the second surface 120 of the object T to be processed may be maintained within about 50 μm by the second pressing portion 320.

The second pressing portion 320 may include at least one ejection hole 321 through which a high-pressure gas may be ejected toward the second surface 120. The second pressing portion 320 is supported by a support bar 323 arranged across the first pressing portion 310 of a ring shape. The support bar 323 may be pneumatically connected by an articulated structure 325. The gas supplied through the support bar 323 may be ejected toward the object T to be processed through the ejection hole 321.

The high-pressure gas ejected by the second pressing portion 320 is discharged between the second pressing portion 320 and the object T to be processed. Accordingly, the Bernoulli effect is generated and thus a suction force may be generated. In contrast, when a distance between the second pressing portion 320 and the object T to be processed is shorter than a certain distance, a repulsive force may be applied to the object T to be processed by the high-pressure gas ejected by the second pressing portion 320.

For example, when the distance between the second pressing portion 320 and the object T to be processed is about 50 μm to about 10 mm, a suction force is generated by the second pressing portion 320, and thus the suction force may act on the object T to be processed in an upward direction. Accordingly, when the object T to be processed warps to be downwardly concave as illustrated in FIG. 3B, the object T to be processed may be made flat by the second pressing portion 320.

For example, when the distance between the second pressing portion 320 and the object T to be processed is about 10 μm or less, a repulsive force is generated by the second pressing portion 320, and thus the repulsive force may act on the object T to be processed in a downward direction. Accordingly, when the object T to be processed warps to be upwardly convex as illustrated in FIG. 3A, the object T to be processed may be made flat by the second pressing portion 320.

As described above, since the second pressing portion 320 applies a suction force or a repulsive force to the middle portion of the object T to be processed in a non-contact manner, the middle portion of the object T to be processed may be made flat. Accordingly, when the height deviation of the object T to be processed is about 4 mm or more, the first pressing portion 310 and the second pressing portion 320 may reduce the height deviation of the object T to be processed to a range in which marking quality does not deteriorate.

Figure 6:
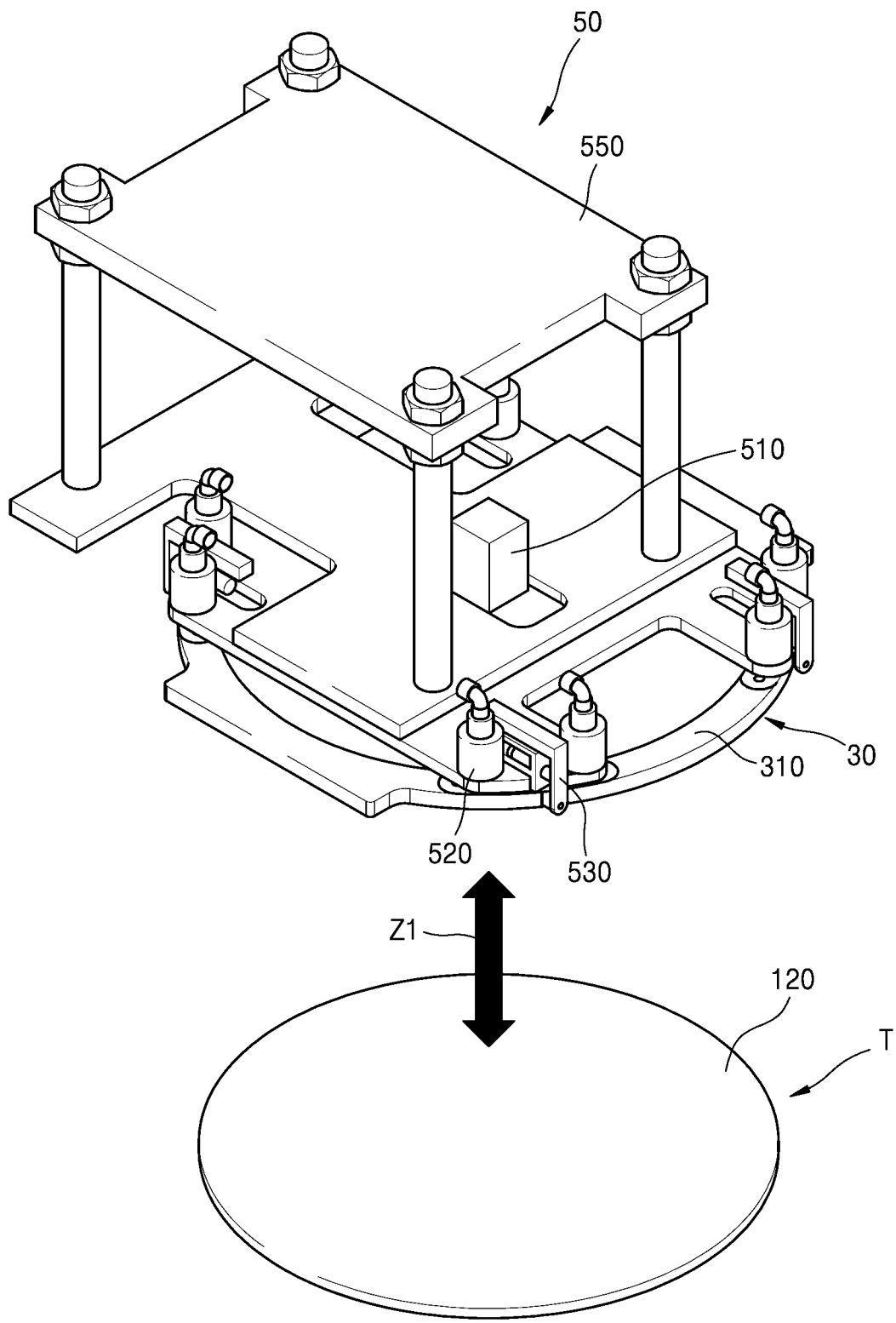
FIG. 6 is a perspective view of a support unit of a laser marking device, according to an embodiment.

FIG. 6 is a perspective view of a support unit 50 of a laser marking device, according to an embodiment.

Referring to FIG. 6, the laser marking device according to the present embodiment may further include the support unit 50 that supports the pressing unit 30 and transfers the pressing unit 30 over the second surface 120 of the object T to be processed.

The support unit 50 may include a suction unit 520 suctioning and supporting the pressing unit 30 and a driving unit 510 transferring the suctioned pressing unit 30 in a vertical direction (Z1 direction).

The suction unit 520 provides a negative (−) pressure to the upper surface of the first pressing portion 310, thereby vacuum-suctioning the first pressing portion 310. Accordingly, the pressing unit 30 is supported by the support unit 50.

The driving unit 510 may be a motor or a cylinder. As the driving unit 510 operates, a transfer frame 550 on which the suction unit 520 is provided may be moved in the vertical direction (Z1 direction). Accordingly, the pressing unit 30 may be transferred over the second surface 120 of the object T to be processed.

For example, the driving unit 510 lowers the transfer frame 550 until the pressing unit 30 approaches or contacts the second surface 120 of the object T to be processed. In this state, the pressing unit 30 is placed on the second surface 120 of the object T to be processed by removing the suction by the suction unit 520, and thus the transfer frame 550 is raised by the driving unit 510.

Figure 7:
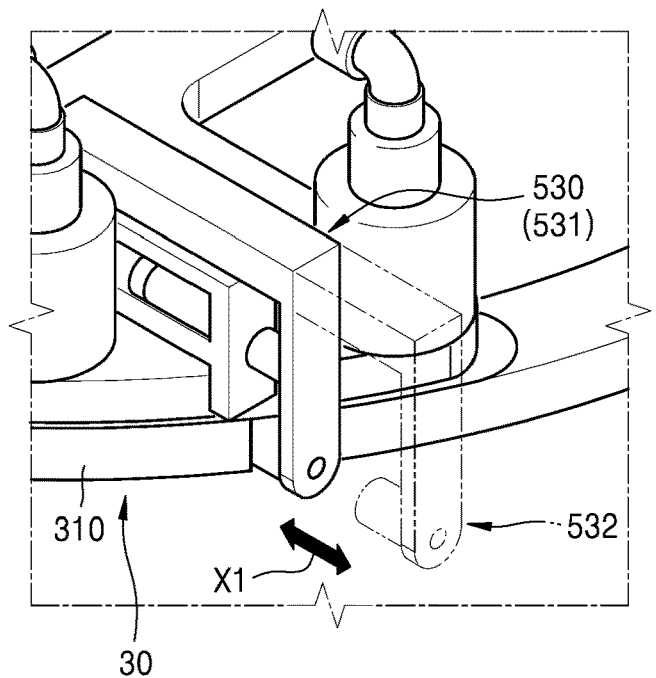
FIG. 7 is a partially enlarged perspective view of FIG. 6, describing a falling prevention unit of the support unit.

FIG. 7 is a partially enlarged perspective view of FIG. 6, describing a falling prevention unit 530 of the support unit 50. Referring to FIGS. 6 and 7, the support unit 50 may further include the falling prevention unit 530 that prevents the pressing unit 30 from undesirably falling.

The falling prevention unit 530 may move between a first position 531 overlapping the pressing unit 30 and a second position 532 that does not overlap the pressing unit 30. The falling prevention unit 530 has a "c" shape, and may move in a direction crossing the gravity direction of the pressing unit 30. For example, the falling prevention unit 530 may move in a horizontal direction, for example, an X1 direction.

In a state in which the falling prevention unit 530 is located at the first position 531, even when the pressing unit 30 is unintentionally separated from the suction unit 520, the pressing unit 30 is supported by the falling prevention unit 530, and thus the pressing unit 30 may be prevented from unintentional falling.

Figure 8A:
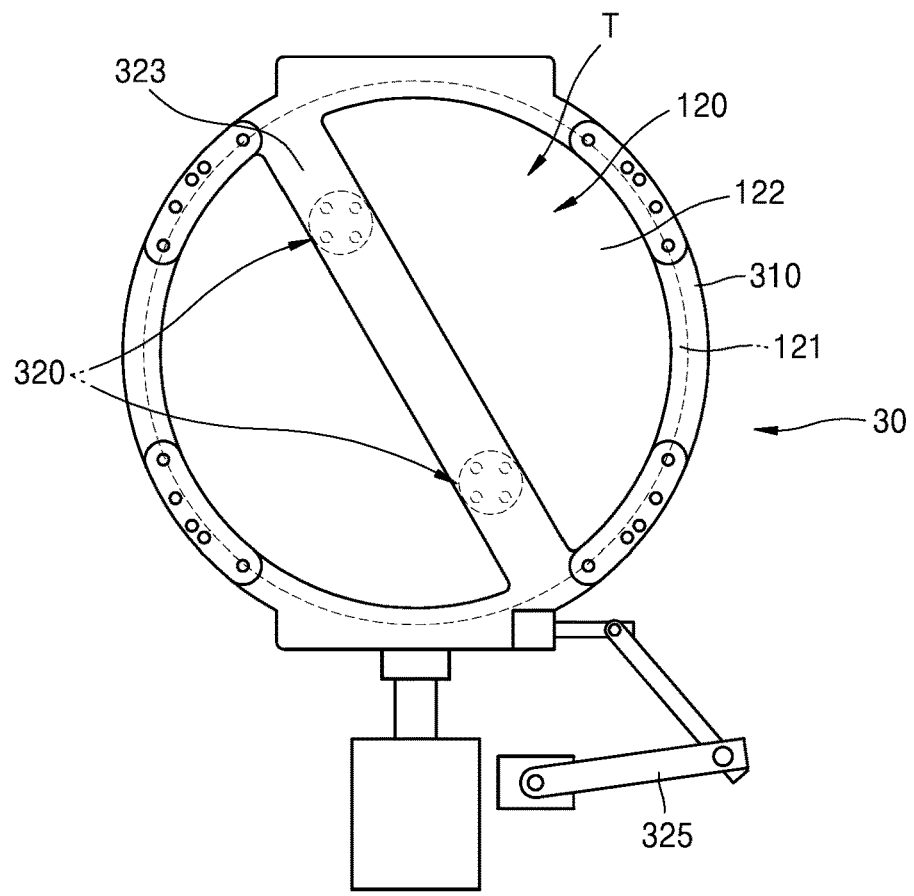
FIGS. 8A and 8B are plan views of a pressing unit according to another embodiment.
Figure 8B:
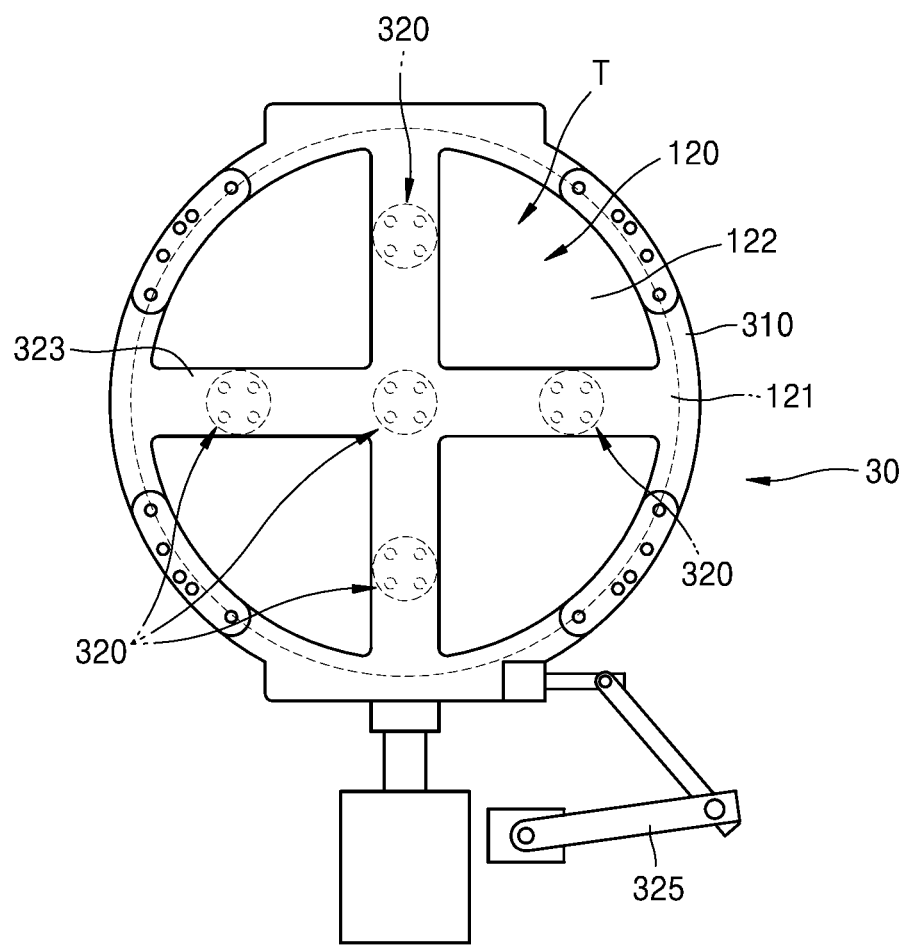

In the above-described embodiments, an example in which the second pressing portion 320 of the pressing unit 30 includes on second pressing portion is described. However, the number of the second pressing portion 320 of the pressing unit 30 is not limited to one, and the second pressing portion 320 may include a plurality of second pressing portions, if necessary. For example, as illustrated in FIG. 8A or FIG. 8B, the second pressing portion 320 may include a plurality of second pressing portions.

FIGS. 9A to 9D illustrate operations of a laser marking method according to an embodiment laser marking method according to an embodiment.

Figure 9A:
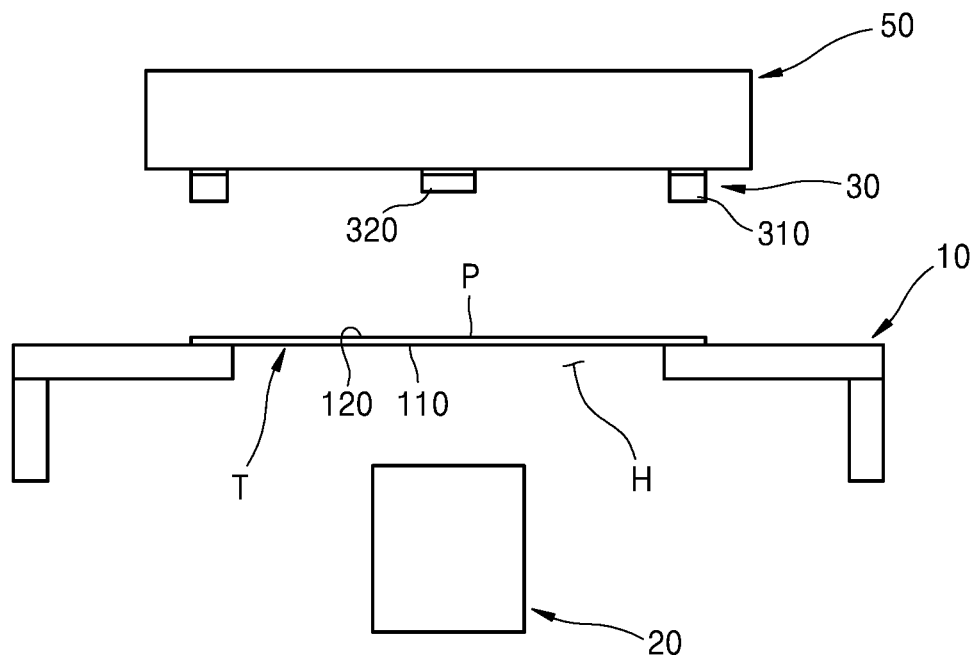
FIGS. 9A to 9D illustrate operations of a laser marking method according to an embodiment.

Referring to FIG. 9A, the object T to be processed may be placed on the work table 10. The object T to be processed may include the first surface 110 where the semiconductor pattern P is not formed and the second surface 120 where the semiconductor pattern P is formed. A part of the first surface 110 of the object T to be processed may be exposed to the laser emission unit 20 through the opening H of the work table 10.

The support unit 50 suctions and supports the pressing unit 30. The pressing unit 30 is arranged above the object T to be processed to be spaced apart therefrom.

Figure 9B:
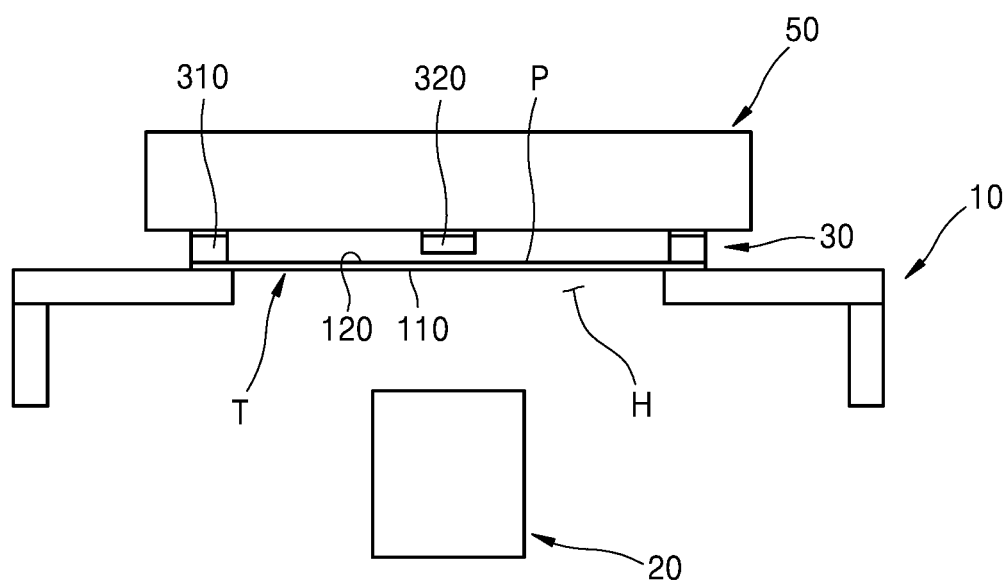

Referring to FIG. 9B, the pressing unit 30 is lowered by the support unit 50 toward the object T to be processed placed on the work table 10. The pressing unit 30 is transferred by the support unit 50 and contacts the second surface 120 of the object T to be processed.

When the pressing unit 30 contacts the object T to be processed, the support unit 50 is raised after the suction to the pressing unit 30 is removed.

Figure 9C:
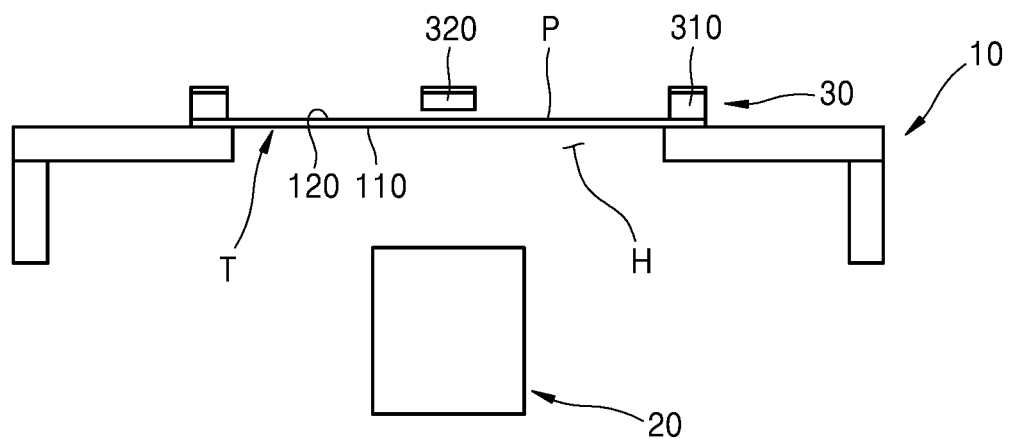

Referring to FIG. 9C, the first pressing portion 310 of the pressing unit 30 contacts the edge area 121 of the second surface 120, and the second pressing portion 320 is spaced apart from the middle area 122 of the second surface 120.

In this state, the first pressing portion 310 contacts and presses the edge portion of the object T to be processed due to the weight thereof, and the second pressing portion 320 presses the middle portion of the object T to be processed 의 middle portion in a non-contact manner by ejecting a high-pressure gas. Accordingly, the height deviation of the object T to be processed may be compensated for by the pressing unit 30 including the first pressing portion 310 and the second pressing portion 320. For example, the height deviation of the object T to be processed compensated for by the pressing unit 30 may be about 4 mm to about 10 mm.

Figure 9D:
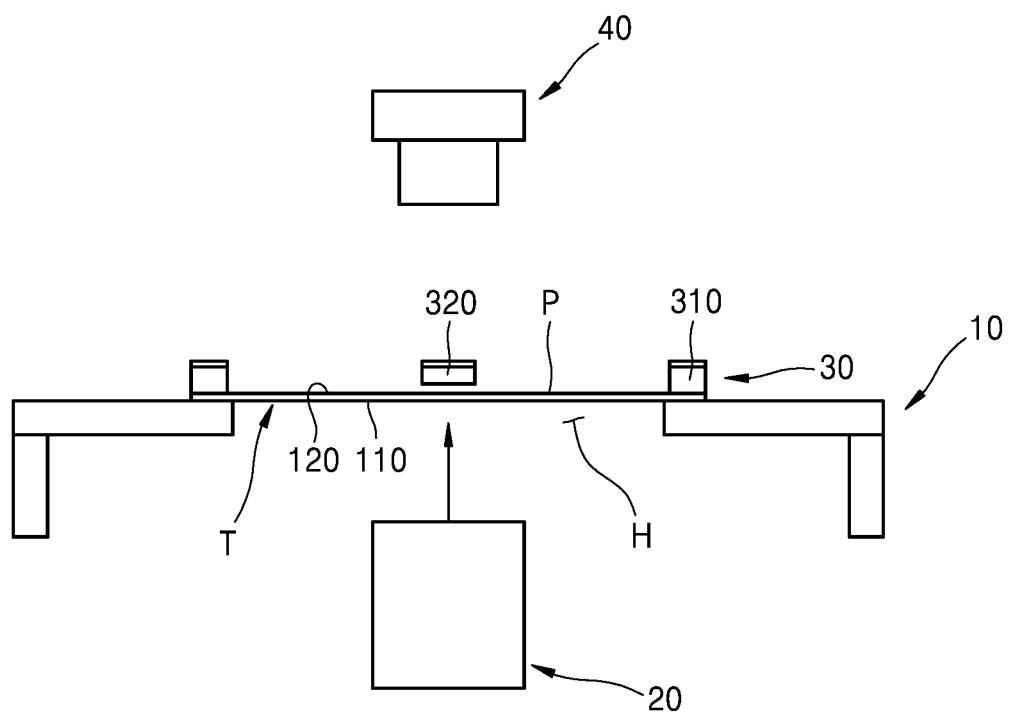

Referring to FIG. 9D, the vision camera 40 takes an image of the semiconductor pattern P of the object T to be processed with a compensated height deviation and identifies the position of the semiconductor pattern P. A marking work is performed on the first surface 110 of the object T to be processed by identifying a processing position from information about the identified position of the semiconductor pattern P.

While the present disclosure has been particularly shown and described with reference to embodiments thereof, it will be understood by those of ordinary skill in the art that various changes in form and details may be made therein without departing from the spirit and scope of the present disclosure as defined by the following claims.

The invention claimed is:

1. A laser marking device comprising:
   a laser emission unit configured to emit a laser beam to a first surface of an object to be processed, and
   a pressing unit configured to press a second surface that is opposite to the first surface of the object to be processed to make the first surface of the object to be flat,
   wherein the pressing unit comprises:
      a first pressing portion configured to press an edge area of the second surface in a contact manner; and
      at least one second pressing portion configured to press a middle area of the second surface in a non-contact manner.

2. The laser marking device of claim 1, wherein the at least one second pressing portion maintains a separation distance from the second surface within a certain distance.

3. The laser marking device of claim 1, wherein the at least one second pressing portion configured to press the middle area of the second surface to prevent from convexity or concavity.

4. The laser marking device of claim 1, wherein the at least one second pressing portion provide a suction force or a repulsive force.

5. The laser marking device of claim 1, wherein the at least one second pressing portion comprises at least one ejection hole through which a gas is ejected toward the second surface of the object to be processed.

6. The laser marking device of claim 1, wherein the first pressing portion presses the edge area of the second surface due to a weight thereof.

7. The laser marking device of claim 1, wherein a semiconductor pattern is arranged in the middle area of the second surface, and the semiconductor pattern is not arranged in the edge area of the second surface.

8. The laser marking device of claim 1, further comprising a support unit configured to support the pressing unit and transfer the pressing unit to the second surface of the object to be processed.

9. The laser marking device of claim 8, wherein the support unit comprises a suction unit configured to suction and support the pressing unit and a driving unit configured to transfer the pressing unit in a vertical direction.

10. The laser marking device of claim 9, wherein the support unit further comprises a falling prevention unit configured to move between a first position overlapping the pressing unit and a second position that does not overlap the pressing unit to prevent falling of the pressing unit.

11. A laser marking method comprising:
   placing an object to be processed on a work table, the object to be processed including a first surface and a second surface that is opposite to the first surface;
   pressing the second surface of the object to be processed to compensate for a height deviation of the object to be processed, which is performed by a pressing unit; and
   performing marking by emitting a laser beam to the first surface of the object to be processed,
   wherein, in the pressing of the second surface, an edge area of the second surface is pressed by a first pressing portion, and a middle area of the second surface is pressed by at least one second pressing portion in a non-contact manner.

12. The laser marking method of claim 11, wherein a separation distance between the second pressing portion and the second surface is maintained by the second pressing portion within a certain distance.

13. The laser marking method of claim 11, wherein the at least one second pressing portion configured to press the middle area of the second surface to prevent from convexity or concavity.

14. The laser marking method of claim 11, wherein the at least one second pressing portion provide a suction force or a repulsive force.

15. The laser marking method of claim 11, wherein the second pressing portion ejects a gas toward the second surface of the object to be processed.

16. The laser marking method of claim 11, wherein the edge area of the second surface is pressed by a weight of the first pressing portion.

17. The laser marking method of claim 11, wherein a semiconductor pattern is arranged in the middle area of the second surface, and the semiconductor pattern is not arranged in the edge area of the second surface.

18. The laser marking method of claim 11, further comprising, before the pressing of the second surface, transferring the pressing unit to the second surface of the object to be processed, which is performed by a support unit.

\* \* \* \* \*